(12) United States Patent
Zhang et al.

(10) Patent No.: US 9,320,163 B2
(45) Date of Patent: Apr. 19, 2016

(54) PORTABLE DOWNLOADER

(75) Inventors: Liuyu Zhang, Wuhan (CN); Beili Song, Wuhan (CN); Tao Yuan, Wuhan (CN)

(73) Assignee: WUHAN TELECOMMUNICATION DEVICES CO., LTD., Wuhan (CN)

( * ) Notice: Subject to any disclaimer, the term of this patent is extended or adjusted under 35 U.S.C. 154(b) by 116 days.

(21) Appl. No.: 14/369,690

(22) PCT Filed: Jul. 16, 2012

(86) PCT No.: PCT/CN2012/078712
§ 371 (c)(1),
(2), (4) Date: Oct. 15, 2014

(87) PCT Pub. No.: WO2013/097450
PCT Pub. Date: Jul. 4, 2013

(65) Prior Publication Data
US 2015/0043182 A1 Feb. 12, 2015

(30) Foreign Application Priority Data
Dec. 30, 2011 (CN) .......................... 2011 1 0453639

(51) Int. Cl.
*H05K 5/02* (2006.01)
*G06F 13/38* (2006.01)
*H05K 5/00* (2006.01)

(52) U.S. Cl.
CPC ............ *H05K 5/0278* (2013.01); *G06F 13/385* (2013.01); *H05K 5/0069* (2013.01); *H05K 5/0086* (2013.01); *H05K 5/0091* (2013.01); *Y02B 60/1228* (2013.01); *Y02B 60/1235* (2013.01)

(58) Field of Classification Search
CPC .................................................. H05K 5/0278
USPC ........................................................ 361/679.31
See application file for complete search history.

(56) References Cited

U.S. PATENT DOCUMENTS 7,887,342 B1 * 2/2011 Yu ....................... G06F 3/03545
361/737
2008/0156871 A1 * 7/2008 Fidalgo ................ G06K 19/007
235/382

(Continued)

FOREIGN PATENT DOCUMENTS

CN 2491892 Y 5/2002
WO 2011127213 A2 10/2011

OTHER PUBLICATIONS

Silicon Laboratories, ToolStick Debug Adapter User's uide, Rev.0.1 Sep. 2006 (Sep. 30, 2006) <http://www.silabls.com/Support%20Documents/TechnicalDocs/ToolStick_Debug_Adapter_UG.pdf>.

*Primary Examiner* — Adrian S Wilson
(74) *Attorney, Agent, or Firm* — Maschoff Brennan

(57) ABSTRACT

Disclosed is a portable downloader comprising a pen-shaped housing and a circuit board provided inside of the pen-shaped housing. Provided at one end of the circuit board is a micro-universal serial bus (MUSB) port. Connected to the circuit board are a ground wire and two data wires. Each data wire is connected to a probe at the other end. Provided at the end of the pen-shaped housing corresponding to the MUSB port is a socket. Provided at the other end are two position-fixing holes. The two probes penetrate the position-fixing holes. The MUSB port connects to a computer universal serial bus (USB) port through a USB-MUSB computer extension wire. The portable downloader uses USB power supply with no need for an external power supply, and supports hot plug. The downloader uses the two probes as the C2 port, and is convenient to transmit data to C2 slave devices. The downloader is of a pen-shaped packaging, and is therefore easy to carry.

8 Claims, 13 Drawing Sheets

(56) References Cited

U.S. PATENT DOCUMENTS

| | | | | |
|---|---|---|---|---|
| 2008/0252621 A1* | 10/2008 | Shipton | ............... | G01D 5/3473 345/179 |
| 2009/0203262 A1* | 8/2009 | Collet | .................. | G06K 7/0013 439/629 |
| 2010/0081483 A1* | 4/2010 | Chatterjee | ........... | H01F 1/15333 455/572 |
| 2010/0146308 A1* | 6/2010 | Gioscia | ................. | G06F 1/1632 713/300 |
| 2011/0182014 A1* | 7/2011 | Zhang | .................. | H05K 5/0278 361/679.4 |

* cited by examiner

PORTABLE DOWNLOADER

TECHNICAL FIELD

The present invention relates to a portable downloader, and in particular, to a microcontroller program downloader having a universal serial bus (USB) communication interface.

BACKGROUND

At present, a digital communication interface may be used to implement real-time detection, information report, on-line control, and program downloading of the microcontroller. A program debugging interface of a Silicon Labs C8051FXXX serial microcontroller is generally a C2 interface comprising a C2CK clock signal and a C2D bidirectional data signal.

A computer normally does not possess these digital interfaces itself. The currently used interfaces are only a serial port, a parallel port, and a universal serial bus (USB) interface. Most of laptop computers possess only the USB interface without the serial port. The USB interface is the most commonly used interface at present, and the feature of hot plugging enables the USB interface to present a prominent advantage in portability. In addition, the USB 2.0 interface reaches 480 Mbit/s in the theoretic transmission rate.

At present, the program downloader in the industry typically uses a conversion circuit between the USB and the serial port to connect the microcontroller first, then is converted into a inter-integrated circuit (I2C), a serial peripheral interface (SPI), or a joint test action group (JTAG) by using the microcontroller, and connects the download pen of the machine or several contact points by using cables in the exterior. However, peripheral devices are in a great quantity, and the reliability is poor, which brings inconveniences to portability and manufacture.

SUMMARY

In view of the above, it is thus a major objective of the present invention to provide an easy-taking portable downloader which is capable of implementing communication directly from a USB interface to a C2 interface.

To achieve the above objective, the present invention provides a portable downloader, comprising: a pen-shaped housing and a circuit board disposed inside of the pen-shaped housing, wherein one end of the circuit board is a micro-universal serial bus (MUSB) port; the circuit board is connected to a ground wire and two data wires, a probe being connected to each data wire at the other end; one end of the pen-shaped housing corresponding to the MUSB interface is provided with a socket, and the other end of the pen-shaped housing is provided with two position-fixing holes; the two probes penetrate the position-fixing holes, and the MUSB interface is connected to a computer universal serial bus (USB) port through a USB-MUSB computer extension cable.

The pen-shaped housing comprises a position-fixing cover, a pen cover, a pen head, a pen holder, and a tail cover that are sequentially connected.

One end of the position-fixing cover is provided with a groove and the position-fixing hole.

One end of the pen cover is in spiral fit with the position-fixing cover, the other end of the pen cover is in interference fit with the pen head, and the pen cover is made of insulating plastics.

The interior of the pen head is an irregular cavity, and is provided with two guide holes, the irregular cavity being provided with a position-fixing clamp which is divided into a left part and a right part, and the inner side of the position-fixing clamp being provided with a grove to clamp the probe.

The pen holder is provided with the circuit board, the inner circumference of the pen holder is provided with a guide groove, the guide groove mating with the two sides of the circuit board, one end of the pen holder being connected to the pen head, and the other end being connected to the tail cover.

The inner circumference of the tail cover is provided with a giving-way groove configured to give way to the circuit board; the tail cover is provided with a socket configured to give way to the MUSB interface; a side of the tail cover is provided with a light transmission opening; an end face of the tail cover far away from the pen holder is provided with a small hole accommodating the ground wire; and the ground wire penetrates the small hole and extends to the outside of the downloader.

The circuit board is provided with a static protector, a ground pin, an indicator, a microprocessor, a C2CK pin, and a C2D pin; the MUSB interface communicates with the microprocessor, C2 data being transmitted between the microprocessor and the C2CK pin and the C2D pin; the static protector is connected to the MUSB interface, the MUSB interface supplies power to the microprocessor, and the C2CK pin and the C2D pin on the circuit board is connected to the probe by soldering the data wire.

The present invention has the advantages and beneficial effects as follows:

1. The USB interface is used to supply power, no external power supply is needed, and hot plugging is supported;
2. The C2 interface is formed by two probes for transmitting data conveniently to C2 slave devices (C8051FXXX serial microcontroller);
3. Pen-shaped package facilitates the carrying;
4. The static protection function is supported;
5. The downloader is small in size, unique in appearance, low in cost, convenient for carrying, and supports more burning formats.

DETAILED DESCRIPTION

Figure 1:
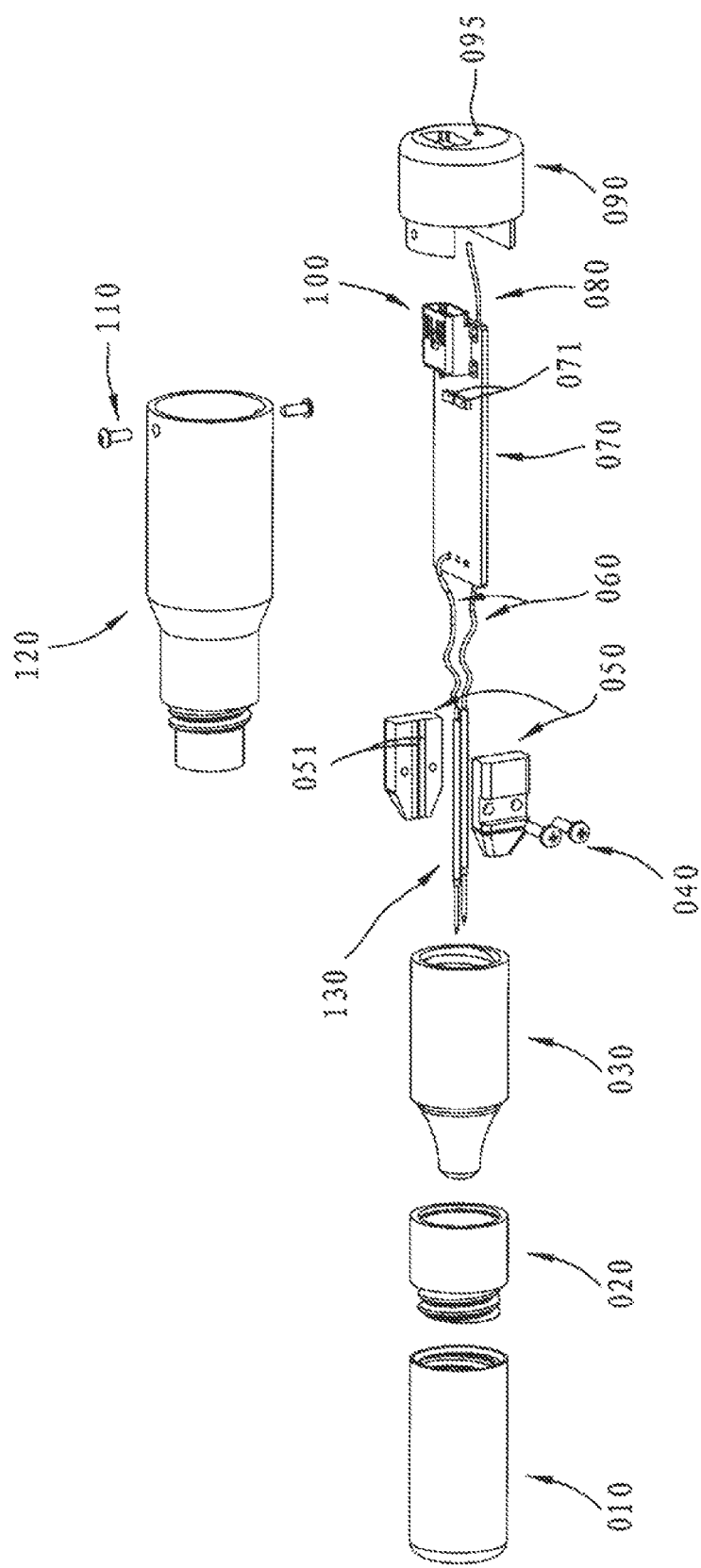
FIG. 1 is a stereoscopic exploded view of a portable downloader according to the present invention.

For ease of a further understanding of the structure of the present invention and the effect achieved, the present invention is described in detail with reference to the accompanying drawings and preferred embodiments.

The downloader in the present invention is further described in detail with reference to the accompanying drawings and preferred embodiments, so that those skilled in the art can better understand and put it into implementation. However, the described embodiments are not intended to define the present invention.

As shown in FIGS. 1 to 8, the downloader in the present invention comprises a pen-shaped housing 1000 and a circuit board 070 disposed inside of the pen-shaped housing 1000, wherein one end of the circuit board 070 is provided with a micro-universal serial bus (MUSB) port 100; the circuit board 070 is connected to a ground wire 080 and two data wires 060, a probe 130 being connected to each data wire 060 at the other end; one end of the pen-shaped housing 1000 corresponding to the MUSB interface is provided with a socket 092, and the other end of the pen-shaped housing 1000 is provided with two position-fixing holes 011; the two probes 130 penetrate the position-fixing holes 011.

The pen-shaped housing 1000 comprises a position-fixing cover 010, a pen cover 020, a pen head 030, a pen holder 120, and a tail cover 090 that are sequentially connected. One end of the position-fixing cover 010 is provided with a groove 012 and a position-fixing hole 011. The probes 130 are inserted into the position-fixing hole 011. The extension lengths of the two probes may be designed according to practical requirements.

One end of the pen cover 020 is in spiral fit with the position-fixing cover 010, and the other end of the pen cover 020 is in interference fit with the pen head 030. The pen cover 020 is made of insulating plastics.

The interior of the pen head 030 is an irregular cavity 032, and is provided with two guide holes 031, the irregular cavity 032 being provided with a position-fixing clamp 050 which is divided into a left part and a right part, and the inner side of the position-fixing clamp 050 being provided with a clamping groove 051 to clamp the probes 130 to the clamping groove 051, to assembly and position the probes 130, such that the probes 130 penetrate the guide hole 031 to the outside of the pen head 030. The two position-fixing clamps 050 are clamped tightly by using head screws 040. The position-fixing clamp 050 is made of insulating plastics. The pen head 030 is also made of insulating plastics.

The pen holder 120 is provided with the circuit board 070, the inner circumference of the pen holder 120 is provided with a guide groove 121, the guide groove 121 mating with the two sides of the circuit board 070, one end of the pen holder 120 being connected to the pen head 030, and the other end being connected to the tail cover 090. The connection end of the pen holder 120 and the tail cover 090 is provided with a giving-way hole 122, the connection end between the tail cover 090 and the pen holder 120 is provided with a bottom hole 094. The giving-way hole 122 is concentric with the bottom hole 094, and a self-tapping screw 110 passes through the giving-way hole 122 and is screwed into the bottom hole 094 of the tail cover 090, thereby fixing the tail cover 090 onto the pen holder 120.

The interior of the tail cover 090 is provided with a part of the circuit board 070, a MUSB interface 100, and a ground wire 080. The inner circumference of the tail cover 090 is provided with a giving-way groove 091 configured to give way to the circuit board 070, and the top surface thereof is provided with a socket 092 configured to give way to the MUSB interface 100. A side of the tail cover 090 is provided with a light transmission opening 093 configured to transmit light emitted from the indicator 073 on the circuit board 070. The end face of the tail cover 090 far away from the pen holder 120 is provided with a small hole 095. The small hole 095 accommodates the ground wire 080 which penetrates the small hole 095 and extends to the outside of the downloader.

Figure 3:
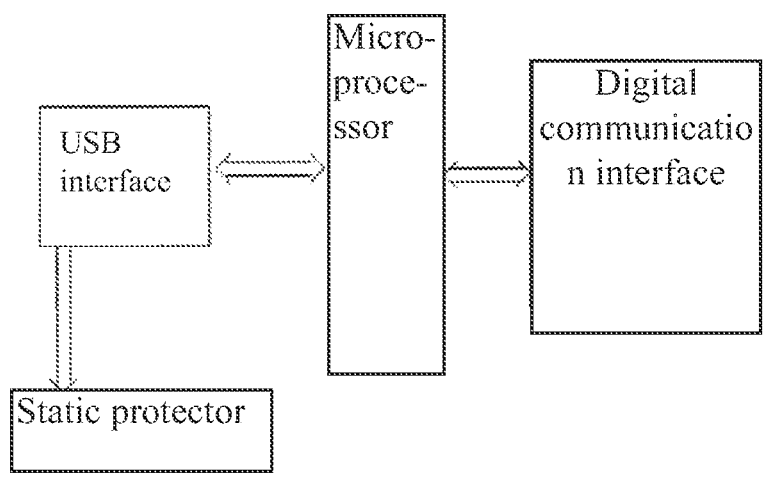
FIG. 3 is a working principle view of the portable downloader according to the present invention.
Figure 4:
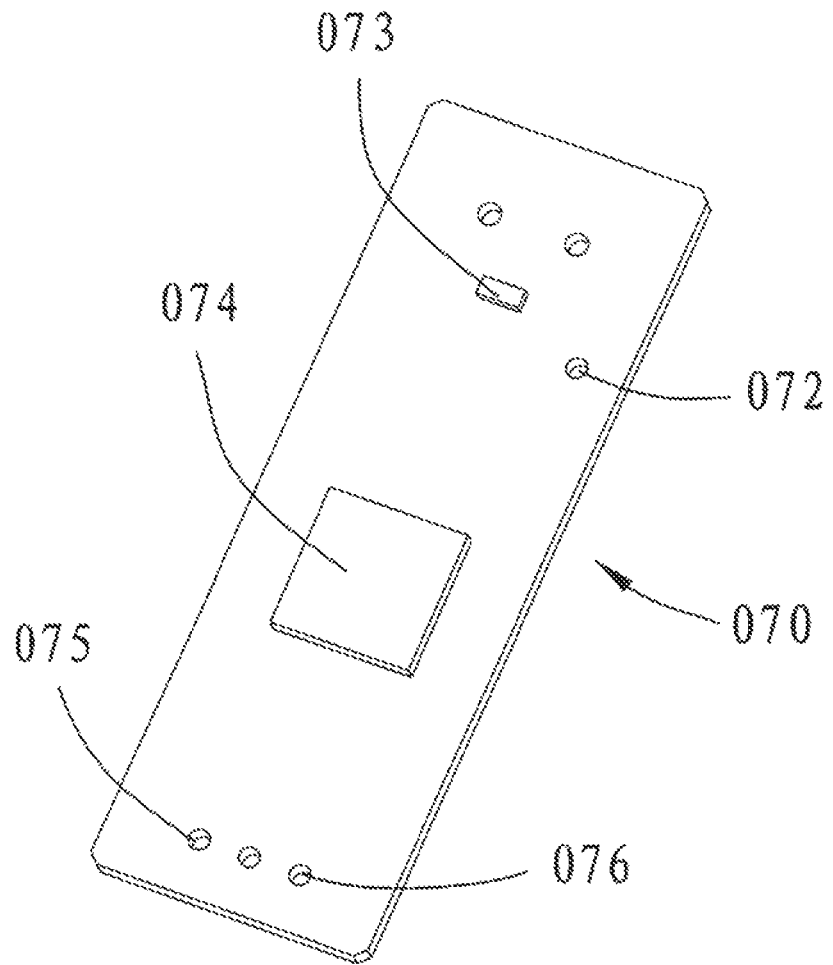
FIG. 4 is a stereoscopic view of a circuit board according to the present invention.
Figure 5:
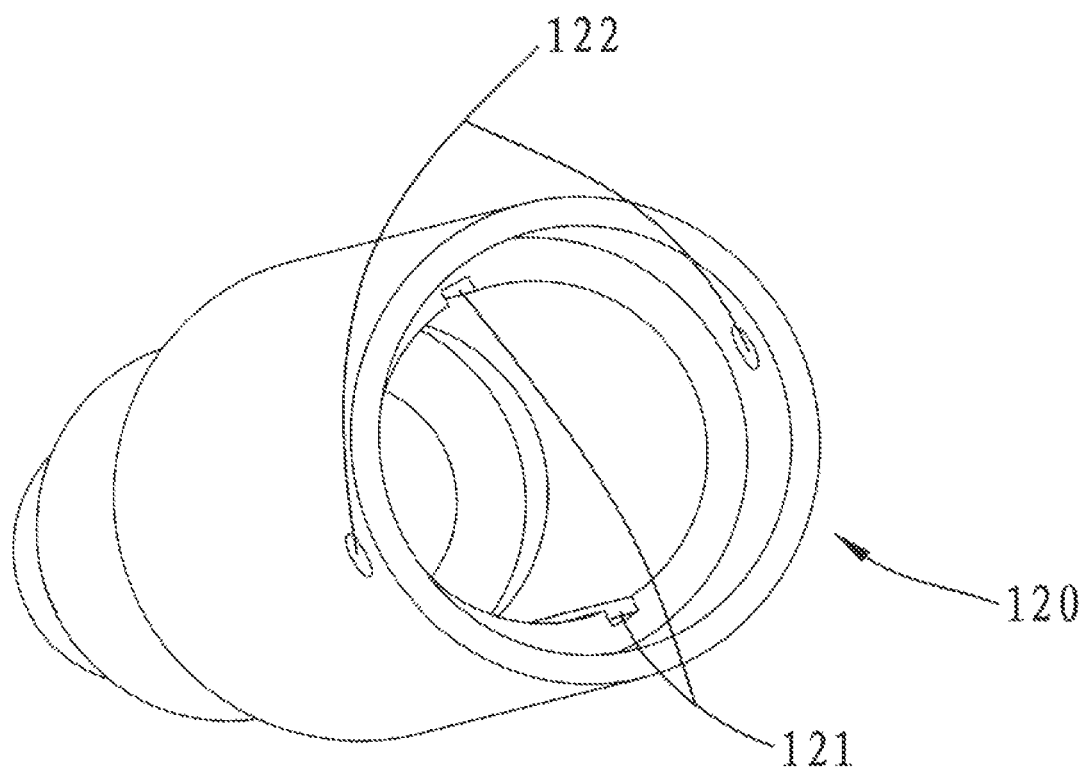
FIG. 5 is a stereoscopic view of a pen holder according to the present invention.
Figure 6:
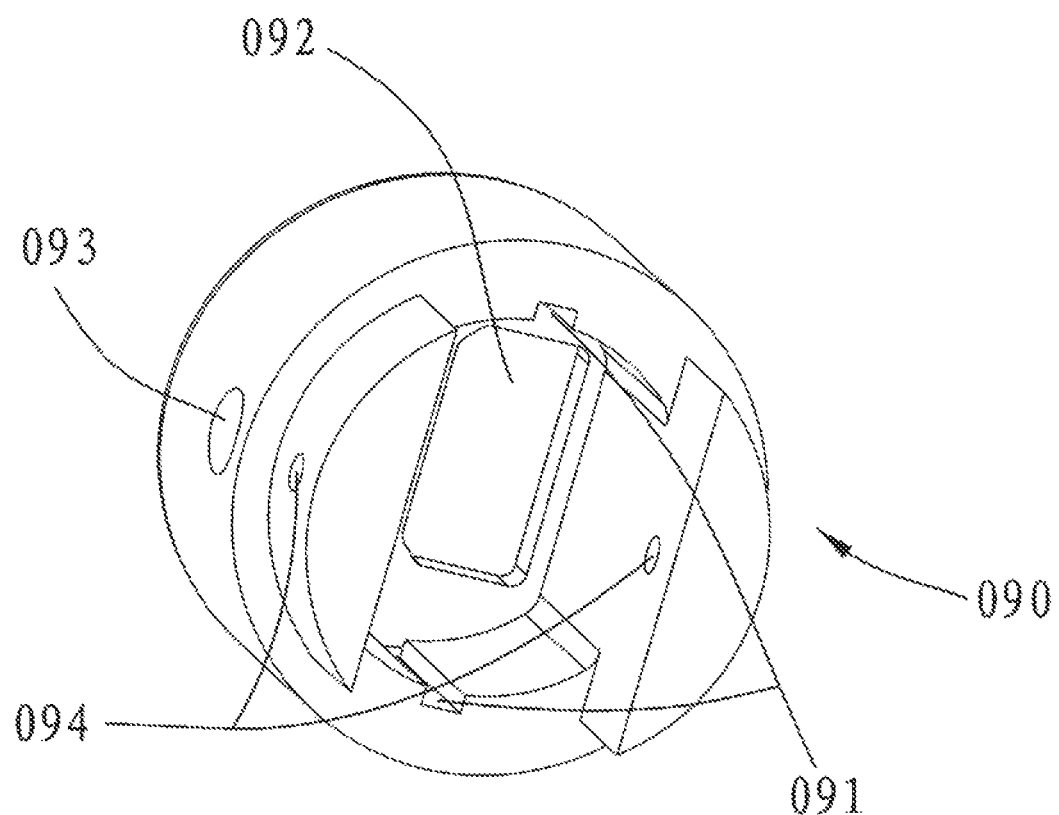
FIG. 6 is a stereoscopic view of a tail cover according to the present invention.
Figure 7:
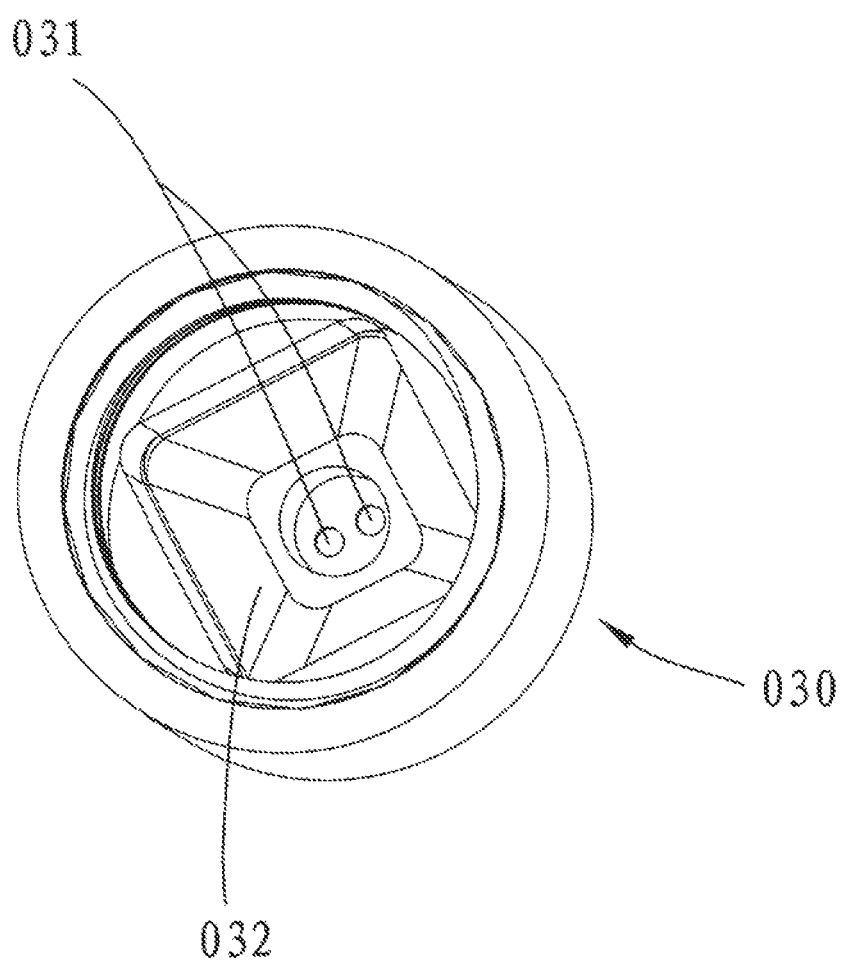
FIG. 7 is a stereoscopic view of a pen head according to the present invention.
Figure 8:
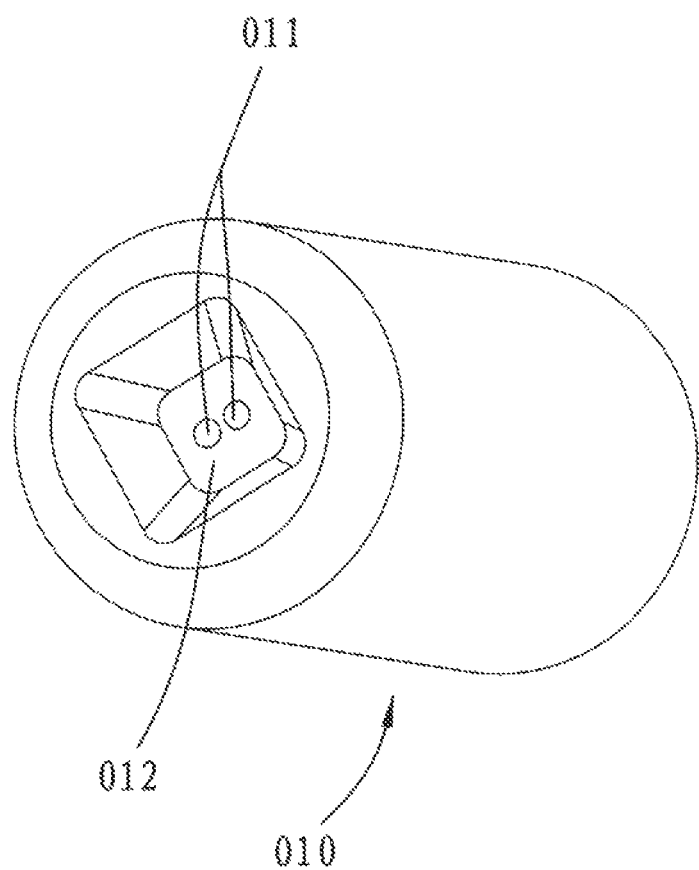
FIG. 8 is a stereoscopic view of a position-fixing cover according to the present invention.

As shown in FIGS. 1, 3 and 4, the circuit board 070 is provided with a static protector 071, a ground pin 072, an indicator 073, a microprocessor 074, and a digital communication interface (that is, a C2CK pin 075 and a C2D pin 076). The MUSB interface 100 communicates with the microprocessor 074, and C2 data transmission is implemented between the microprocessor 074 and the C2CK pin 075 and C2D pin 076. The static protector 071 is connected to the MUSB interface 100. The MUSB interface 100 supplies power to the microprocessor 074. The C2CK pin 075 and the C2D pin 076 on the circuit board 070 are connected to the probes 130 by soldering the data wire 060.

Figure 2:
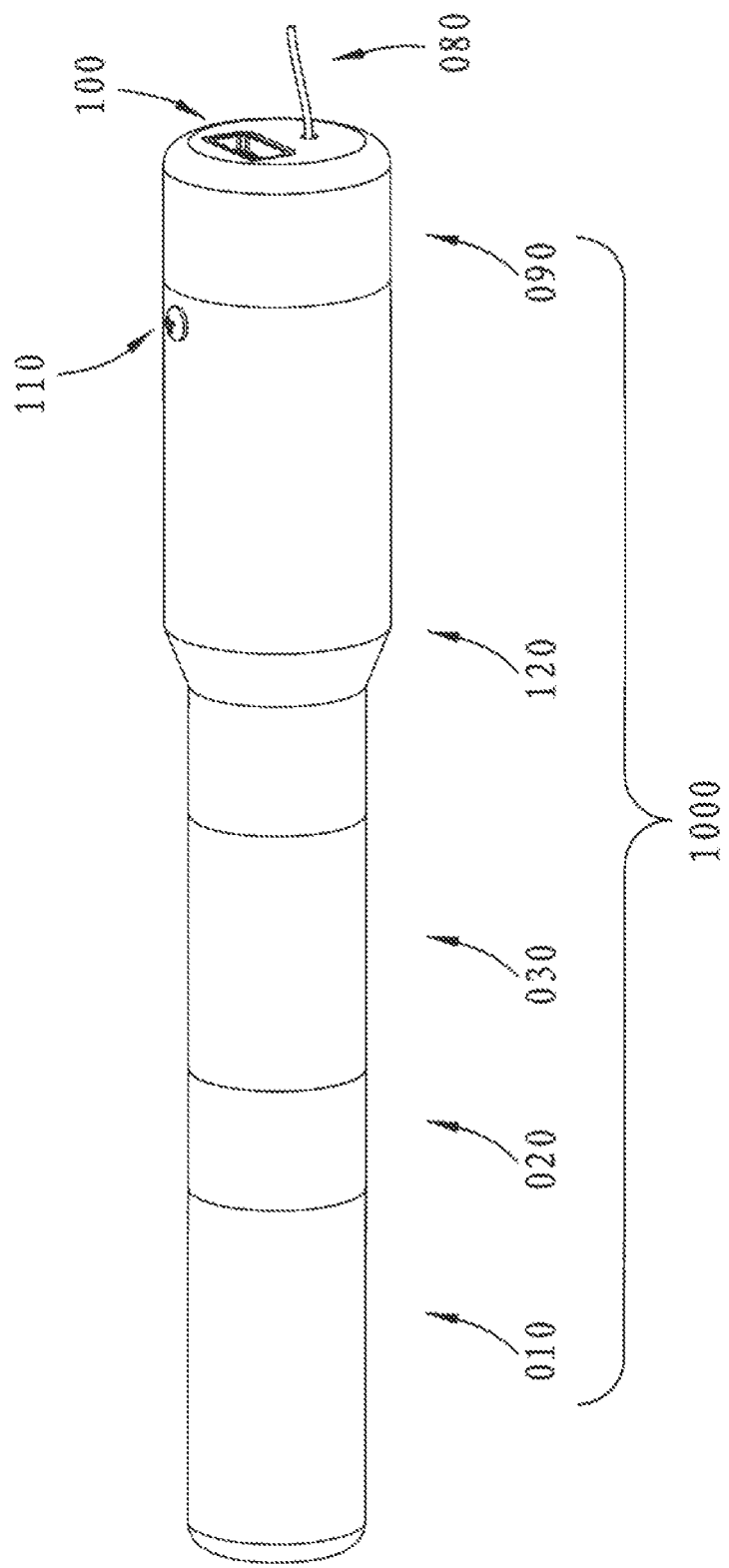
FIG. 2 is a stereoscopic combination view of the portable downloader according to the present invention.

If the LED indicator 073 on the circuit board 070 is on, the USB supplies power normally. The ground pin 072 on the circuit board 070 is connected to the outside of the downloader by soldering the ground wire 080, and configured to horizontally connect with the external devices. As shown in FIGS. 1 and 2, the MUSB interface 100 is soldered on the circuit board 070, and configured to communicate with the computer and supply power to the microprocessor 074. As shown in FIG. 1, the probes 130 are respectively connected to the C2Ck pin 075 and the C2D pin 076 on the circuit board 070 via the data wire 060, and configured to connect the C2 slave devices, comprising a C2CK clock signal and a C2D bidirectional data signal.

The working principles of the present invention are as follows:

The core part of the downloader is the microprocessor, the downloader communicates with an upper computer (for example, a PC) via the USB. A bottom digital communication interface is C2 interface (that is a C2CK interface and a C2D interface), wherein the C2 interface is an in-chip two-wire development interface from Silicon Labs. The MUSB interface is a standard micro-USB connector complying with the USB 2.0 protocol. The microprocessor is a micro central processing unit (CPU), and performs communication conversion between the USB and C2. The digital communication interface is C2 interface. The static protector may prevent the ambient static interference.

The communication using USB interface needs to install a driver. After installation, the system will identify the USB as a virtual serial port, which may be used as a common serial port.

A user sends to-be-sent data to the downloader via the USB; and the downloader stores the received data in a data buffer area, and sends the data to C2 slave devices via the probe of the C2 interface.

Assembling steps of the downloader are as follows:

1. Solder the data wire, the ground wire and the MUSB interface on the circuit board;

2. Solder probes to the other end of the data wire;

3. Make the probes, the data wire, and the circuit board go through the pen holder along the guide groove in the direction of a larger opening of the pen holder;

4. Assembly the position-fixing clamp and the probes on the position-fixing cover based on the relative positions thereof, and clamp the probes tightly to the head screw;

5. Insert the probes and the position-fixing clamp together into the irregular cavity of the pen head;

6. Screw on the pen holder and pen head tightly;

7. Cover the tail cover to the larger opening of the pen holder, such that the MUSB interface and the ground wire are exposed;

8. Use a self-tapping screw to fix the pen holder and tail cover;

9. Screw up the position-fixing cover and pen cover;

10. Cover the assembled pen cover on the pen head;

11. Solder a crocodile clamp on the exposed end of the ground wire.

As shown in FIGS. 9 to 13, the specific working process of the present invention is as follows:

The USB end of one USB-MUSB computer extension wire is connected to the USB interface of the computer, and the MUSB end is connected to the downloader MUSB interface 100. The crocodile clamp on the end of the ground wire 080 is connected to the horizon of the external device. If the LED indicator 073 is on as observed through the light transmission hole 093, the power supply for the downloader is normal. The pen cover 20 is taken off, the long probe of the probes 130 is connected to a C2 salve device (C8051FXXX serial microcontroller) debugging interface C2D, and the short probe of the probes 130 is connected to a C2 slave device debugging interface C2CK. The central spacing between the solder plate of C2CK and the microcontroller debugging interface C2D is required to be the same as the spacing between two probes of the probes 130 of the downloader.

Figure 9:
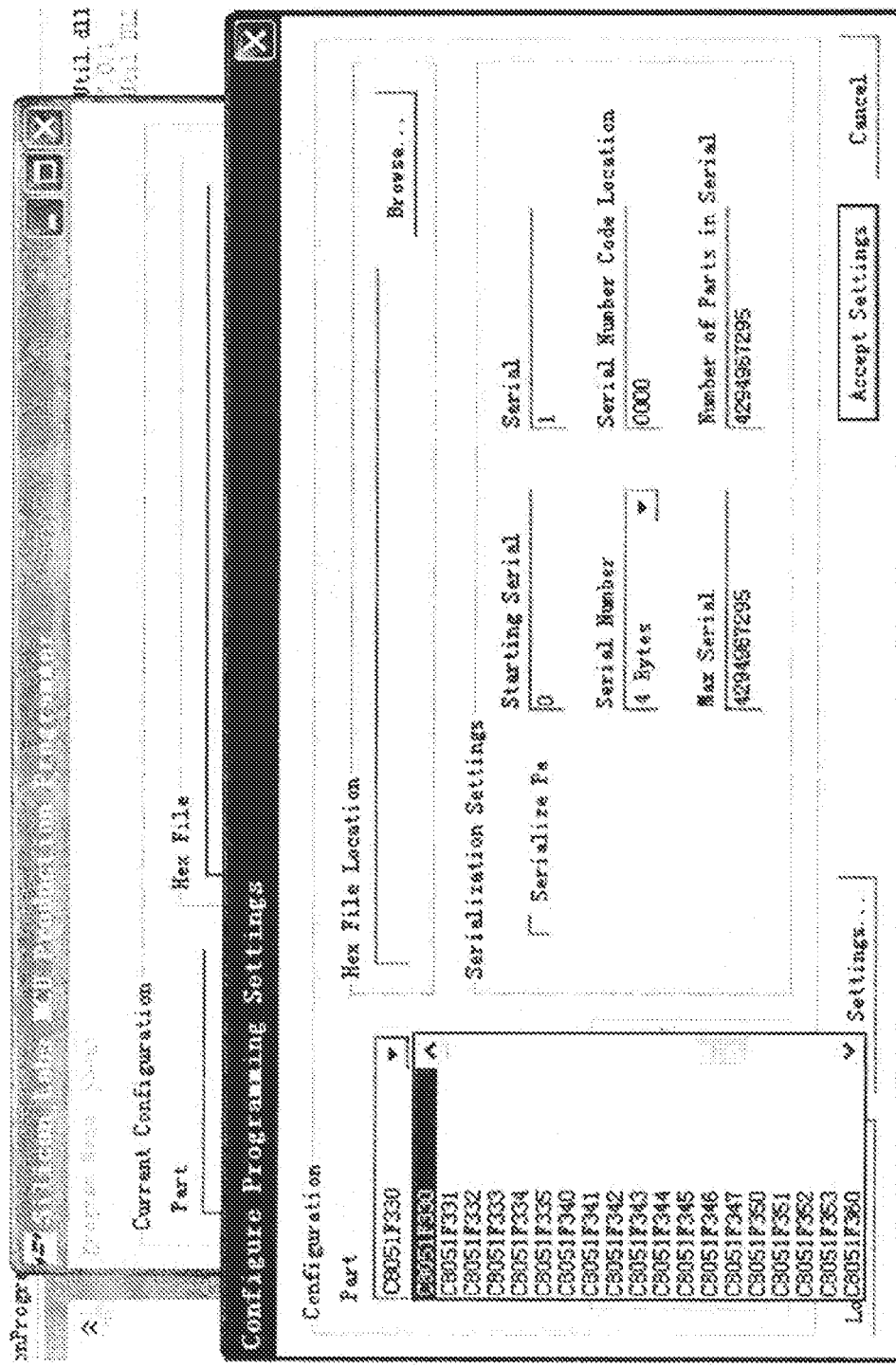
FIGS. 9 to 13 are step views of a software interface during a working process of the portable downloader according to the present invention.
Figure 10:
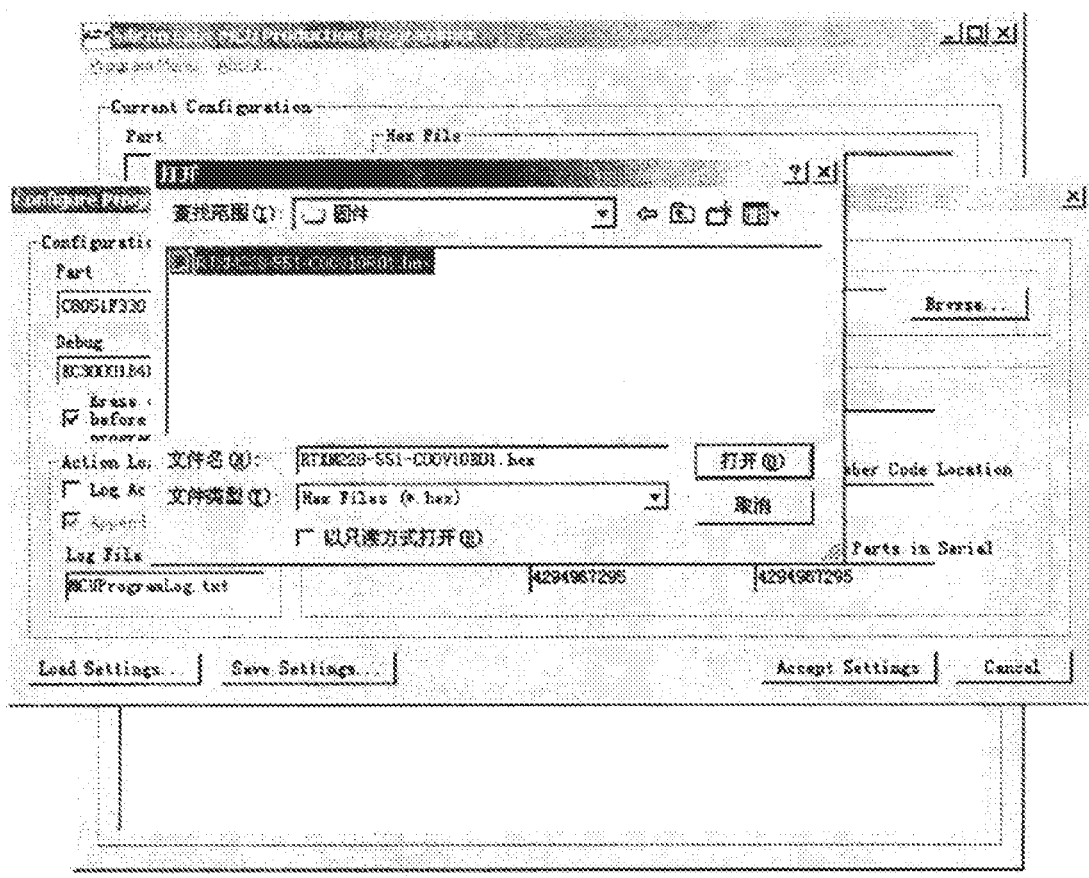
Figure 11:
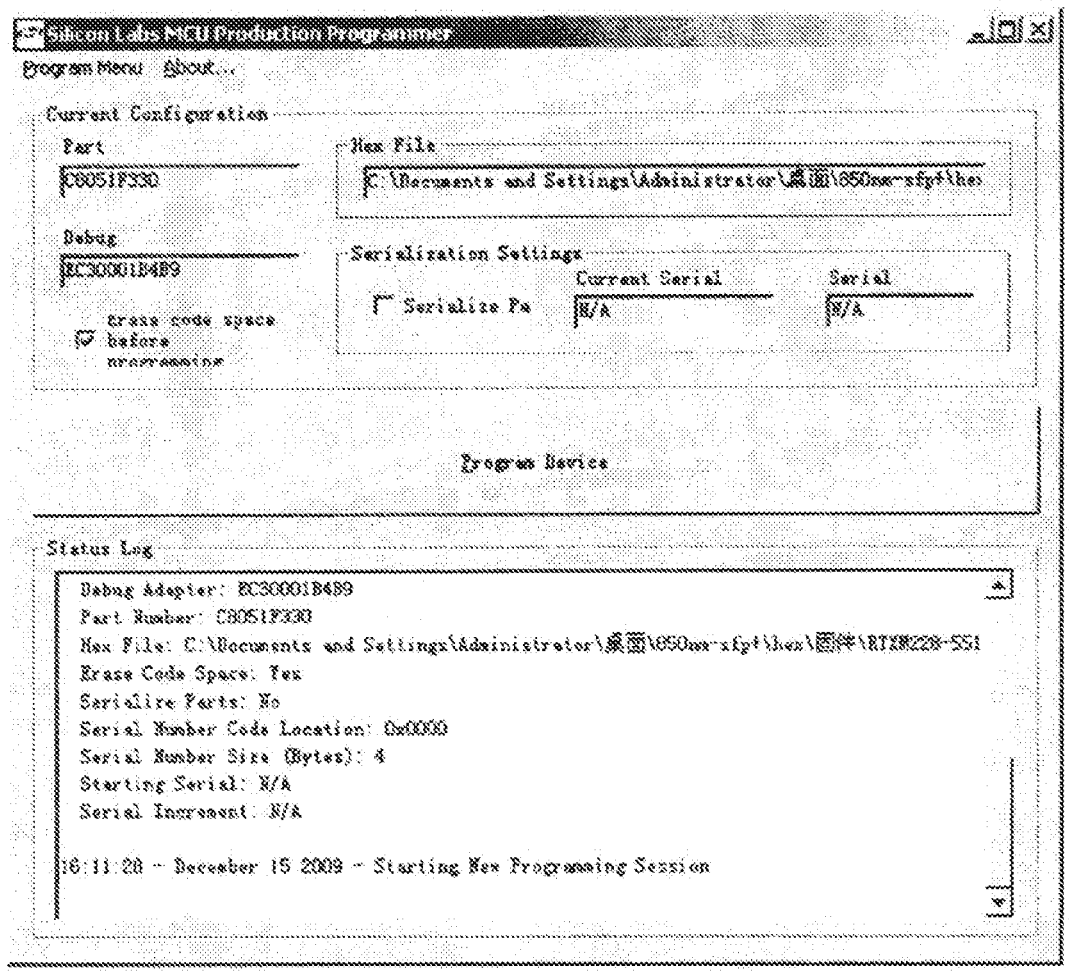
Figure 12:
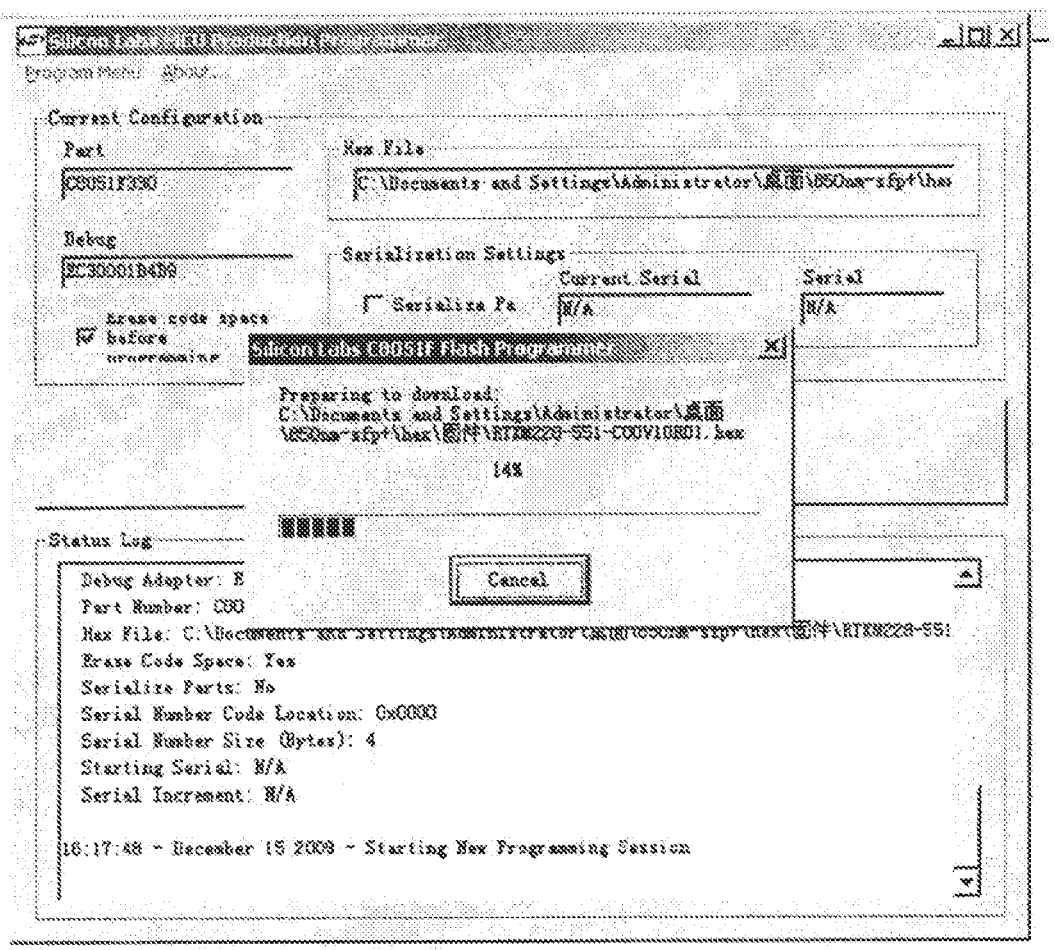
Figure 13:
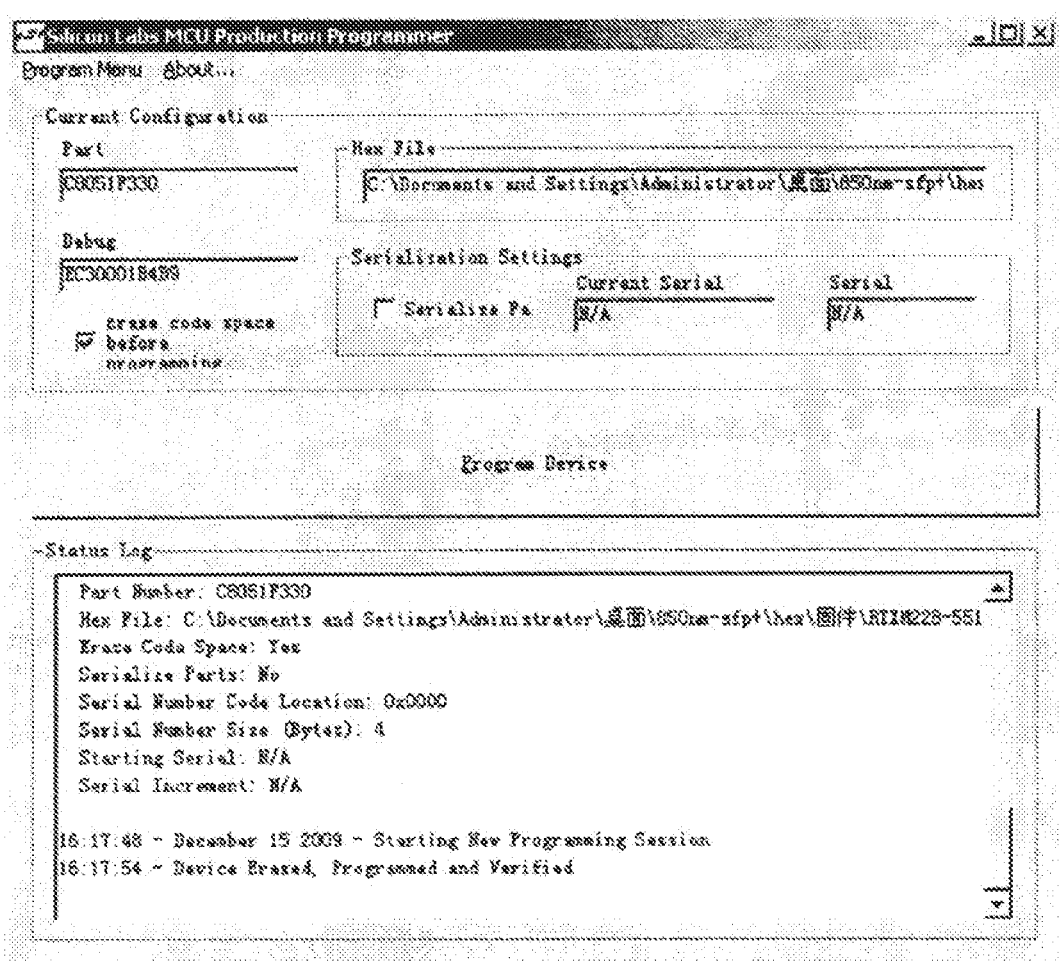

In the software interface, select the models of the slave device microcontroller (as shown in FIG. 9), select the firmware to be downloaded (as shown in FIG. 10), click the download button "program device" (as shown in FIG. 11). FIG. 12 shows a successful connection and the download is under way. FIG. 13 shows a successful download. Change the tested module (C2 slave device), and repeat steps shown in FIGS. 11 to 13 upon the successful download.

The above embodiments are merely preferred embodiments of the present invention, but are not intended to define the protection scope of the present invention.

The invention claimed is:

1. A portable downloader, comprising: a pen-shaped housing and a circuit board disposed inside of the pen-shaped housing, wherein one end of the circuit board is provided with a micro-universal serial bus (MUSB) port; the circuit board is connected to a ground wire and two data wires, a probe being connected to each data wire at the other end; one end of the pen-shaped housing corresponding to the MUSB interface is provided with a socket, and the other end of the pen-shaped housing is provided with two position-fixing holes; the two probes penetrate the position-fixing holes, and the MUSB interface is connected to a computer universal serial bus (USB) port through a USB-MUSB computer extension wire.

2. The portable downloader according to claim 1, wherein the pen-shaped housing comprises a position-fixing cover, a pen cover, a pen head, a pen holder, and a tail cover that are sequentially connected.

3. The portable downloader according to claim 2, wherein one end of the position-fixing cover is provided with a groove and the position-fixing hole.

4. The portable downloader according to claim 2, wherein one end of the pen cover is in spiral fit with the positioning cover, the other end of the pen cover is in interference fit with the pen head, and the pen cover is made of insulating plastics.

5. The portable downloader according to claim 2, wherein the interior of the pen head is an irregular cavity, and is provided with two guide holes, the irregular cavity being provided with a position-fixing clamp which is divided into a left part and a right part, and the inner side of the position-fixing clamp being provided with a clamping groove to clamp the probes.

6. The portable downloader according to claim 2, wherein the pen holder is provided with the circuit board, the inner circumference of the pen holder is provided with a guide groove, the guide groove mating with the two sides of the circuit board, one end of the pen holder being connected to the pen head, and the other end of the pen holder being connected to the tail cover.

7. The portable downloader according to claim 2, wherein: the inner circumference of the tail cover is provided with a giving-way groove configured to give way to the circuit board; the tail cover is provided with a socket configured to give way to the MUSB interface; a side of the tail cover is provided with a light transmission opening; an end face of the tail cover far away from the pen holder is provided with a small hole, the small hole accommodating the ground wire; and the ground wire penetrates the small hole and extends to the outside of the downloader.

8. The portable downloader according to claim 2, wherein: the circuit board is provided with a static protector, a ground pin, an indicator, a microprocessor, a C2CK pin, and a C2D pin; the MUSB interface communicates with the microprocessor, C2 data being transmitted between the microprocessor and the C2CK pin and the C2D pin; the static protector is connected to the MUSB interface, the MUSB interface supplies power to the microprocessor, and the C2CK pin and the C2D pin on the circuit board is connected to the probe by soldering the data wire.

* * * * *